(12) United States Patent
Peeters et al.

(10) Patent No.: US 8,115,228 B2
(45) Date of Patent: Feb. 14, 2012

(54) LIGHTING DEVICE OF LEDS ON A TRANSPARENT SUBSTRATE

(75) Inventors: Martinus Petrus Joseph Peeters, Eindhoven (NL); Virginie Mercier, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 155 days.

(21) Appl. No.: 12/518,644

(22) PCT Filed: Dec. 11, 2007

(86) PCT No.: PCT/IB2007/055029
§ 371 (c)(1),
(2), (4) Date: Jun. 11, 2009

(87) PCT Pub. No.: WO2008/075248
PCT Pub. Date: Jun. 26, 2008

(65) Prior Publication Data
US 2010/0059784 A1   Mar. 11, 2010

(30) Foreign Application Priority Data
Dec. 18, 2006  (EP) .................................. 06126320

(51) Int. Cl.
*H01L 33/00* (2010.01)
(52) U.S. Cl. . 257/99; 257/88; 257/E33.57; 257/E33.066
(58) Field of Classification Search .................. 257/88, 257/99, E33.057, E33.066
See application file for complete search history.

(56) References Cited

U.S. PATENT DOCUMENTS

| 4,663,652 A | 5/1987 | Nishizawa |
| 4,959,510 A | 9/1990 | Matsusaka et al. |
| 5,798,811 A | 8/1998 | Hermens et al. |
| 6,270,236 B1 * | 8/2001 | Brussog ....................... 362/235 |
| 2004/0012958 A1 | 1/2004 | Hashimoto et al. |
| 2005/0035354 A1 | 2/2005 | Lin et al. |
| 2005/0133806 A1 | 6/2005 | Peng et al. |
| 2006/0169994 A1 | 8/2006 | Tu et al. |

FOREIGN PATENT DOCUMENTS
JP       04199754 A       7/1992
* cited by examiner

*Primary Examiner* — Cuong Q Nguyen
*Assistant Examiner* — Tran Tran
(74) *Attorney, Agent, or Firm* — Mark L Beloborodov

(57) ABSTRACT

Proposed is a lighting device (100), comprising LEDs (130) mounted on a transparent substrate (110), provided with a transparent electrically conductive layer (120) and a contact pad (140). The contact pad has a second part (142), extending away from a first part (141), for further reducing the current density in the conductive layer (120). This is advantageous for making the lighting device robust to large power dissipation, especially under high current testing conditions. Moreover, as the voltage drop over transparent conductive layer is reduced, the efficiency of the lighting device is increased.

13 Claims, 3 Drawing Sheets

(PRIOR ART – Side View)

LIGHTING DEVICE OF LEDS ON A TRANSPARENT SUBSTRATE

FIELD OF THE INVENTION

The invention relates to a lighting device comprising LEDs mounted on a transparent substrate. In particular, the invention relates to the contact interface of an LED to a glass substrate coated with a transparent electrode.

BACKGROUND OF THE INVENTION

A lighting device of the kind set forth is known from U.S. Pat. No. 6,270,236. That document discloses a lighting device including a transparent carrier panel provided with transparent electrically conductive structures (e.g. an ITO layer) on one of the panel surfaces. On the carrier panel an LED—with terminals on both sides of a light emitting side—is mounted in such a way that the terminals are in contact with the conductive structures via a conductive adhesive (e.g. a soldering bump.) In particular, the conductive structure may have an additional electrically conductive contact pad in the form of a metal coating in the area of contact with the terminals of the LED. The advantage of this approach is disclosed to be an increase in contact stability.

However, experience shows that the increased stability provided by the metal contact pads in the direct vicinity of the LED terminals is limited. Due to the low conductivity of the ITO layer (R□~15 Ohm) the lighting device is prone to failure. Especially under high current testing and over lifetime, the device fails as the electrical contact of the LED with the contact pad/ITO layer is lost due to very local heat dissipation.

SUMMARY OF THE INVENTION

It is an object of the present invention to provide a lighting device, comprising an LED and a substrate provided with a conductive layer, which is robust to large power dissipation, especially under high current conditions. A lighting device comprising a carrier plate, a structured electrically conductive layer, provided on a first surface of the carrier plate and having a sheet resistance $R_{tcl}$, a LED having a terminal, a contact pad, provided on the layer, with a sheet resistance $R_{cp}$, the ratio $R_{tcl}/R_{cp}$ being larger than 1, the contact pad having a first part, the LED terminal being coupled to the electrically conductive layer via the first part, characterized in that the contact pad further has a second part extending away from the LED for reducing the current density in the conductive layer.

The invention provides a lighting device that realises a significant reduction of the power dissipation in the transparent conductive layer. For it is largely there where the highest power is dissipated. The power dissipation results from an increased current density in the conductive layer directly outside the metallic contact-pad. By extending the contact-pad substantially beyond the terminal of the LED, the current density increase in the layer is considerably moderated. Hence, the lighting device according to the invention is robust to power dissipation, especially under high current conditions. Moreover, as the voltage drop over transparent conductive layer is reduced, the efficiency of the lighting device is increased.

In an embodiment of the present invention, the second part of the contact pad has a first edge with a length $L_{cp}$, a second edge with a width $W_{cp}$, $L_{cp}$ and $W_{cp}$ satisfying the relation $L_{cp} \leq W_{cp} * R_{tcl}/R_{cp}$.

According to an embodiment of the present invention, the second part of the contact pad is free from sharp angles. This advantageously prevents increased current density levels, which are typically found near sharp angles.

In an embodiment of the lighting device according to the invention the electrically conductive layer is structured by a separating groove, and the second part of the contact pad extending away from the LED perpendicular to the groove.

In an embodiment of the invention the width $W_{cp}$ of the second part is smaller than the size of the contact pad's first part to which the second part is connected. This advantageously optimizes the transparency of the lighting device 100.

In an embodiment the contact pad comprises a metal.

In an embodiment the electrically conductive layer comprises a metal-oxide, which is chosen from the group consisting of $InO_x$:Sn, $SnO_x$:F, $SnO_x$:Sb, $ZnO_x$:Ga, $ZnO_x$:B, $ZnO_x$:F, $ZnO_x$:Al and Ag/$TiO_x$.

These and other aspects of the invention will be apparent from and elucidated with reference to the embodiments described hereinafter.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
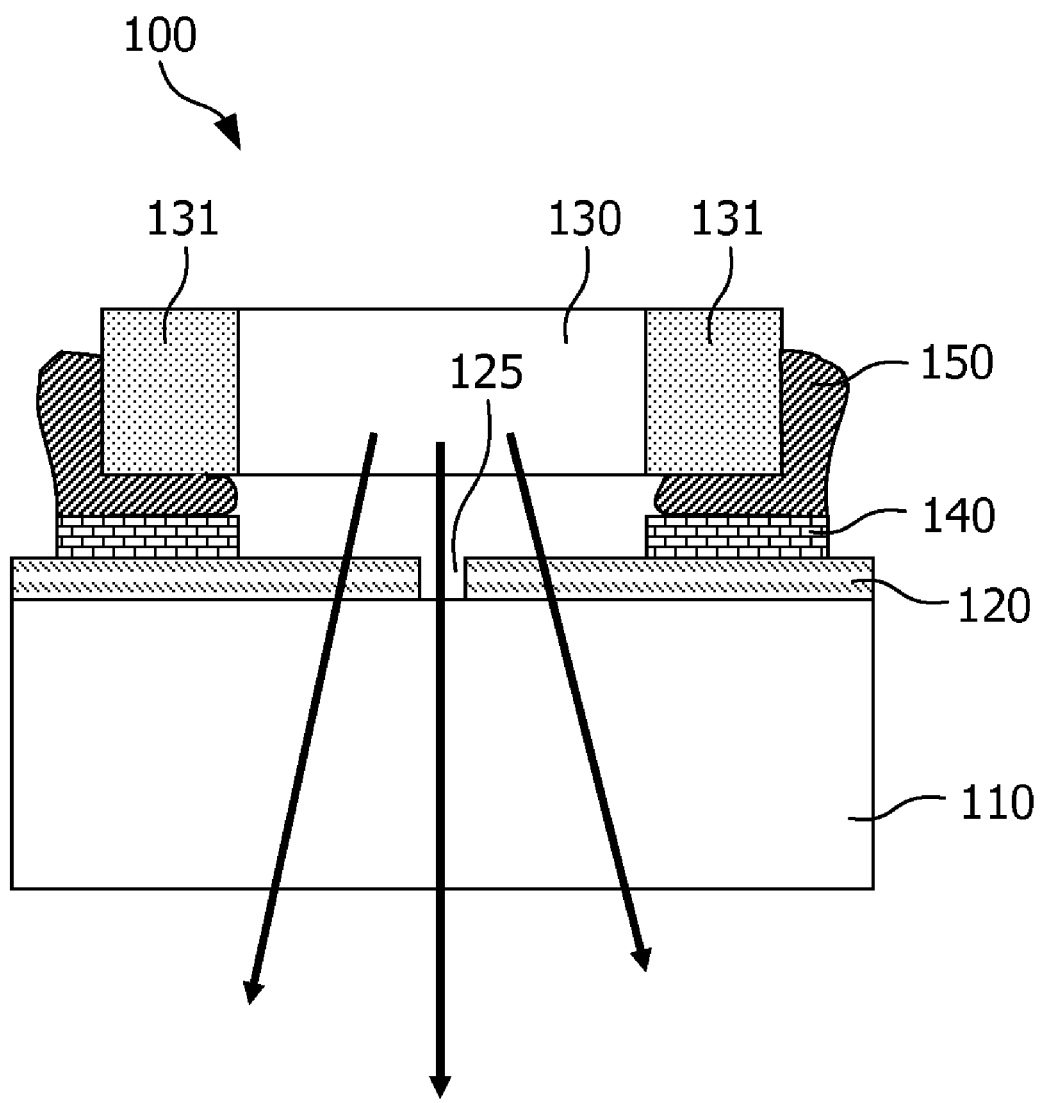
FIG. 1 shows a prior art lighting device in side view.

FIG. 1 shows a lighting device 100 according to the prior art. It comprises a transparent substrate 110, usually made of glass or a plastic like PVC. This glass panel 110 is provided with a transparent electrically conductive layer or coating 120 on one of its surfaces. Typically the layer 120 is made from an Indium-Tin Oxide coating. The layer 120 is structured, usually through laser ablation, by separation grooves 125. Across the groove 125, an LED 130 is mounted. The LED terminals 131 are coupled to the conductive layer 120 by means of a conductive adhesive 150, e.g. glue or solder. In order to increase the contact stability of the LED, an additional metal coating can be applied on top of the ITO layer 120 to form a contact pad 140 for the solder bumps 150. Connecting the separated parts of the layer 120 to a power source (not shown) will light up the LED. As indicated in FIG. 1, the LED 130 emits light in a downward direction. That is to say, through the transparent substrate 110.

The lighting devices so manufactured are very suitable for decorative applications. Furthermore, they can be applied as glass doors, in showcases, as wainscots, or even as a wall itself. The conductive layer 120 and LEDs 130 can be structured and positioned to make (multi-colour) figurative forms light up in an otherwise (almost) complete transparent panel. Alternatively, textual messages can be displayed. For instance, the name of a shop can be brought to light up when the lighting device is used as the shop's window.

In order to safeguard against more expensive fall out later on the production line, the electronic structure on the glass panel 120 is usually tested under stress conditions. Experience shows many lighting devices 100 fail due to the high currents used under such testing condition and/or over the lifetime of the device. Failure of a device 100 results from thermal hot spots, causing a loss of the electrical connection between the LED 130 and the conductive layer 120. Energy dissipation as a result of current crowding inside the layer 120 with its finite sheet resistance $R_{tcl}$ gives rise to the hot spot. The situation deteriorates even further due to the positive temperature dependence of the sheet resistance $R_{tcl}$.

Figure 2:
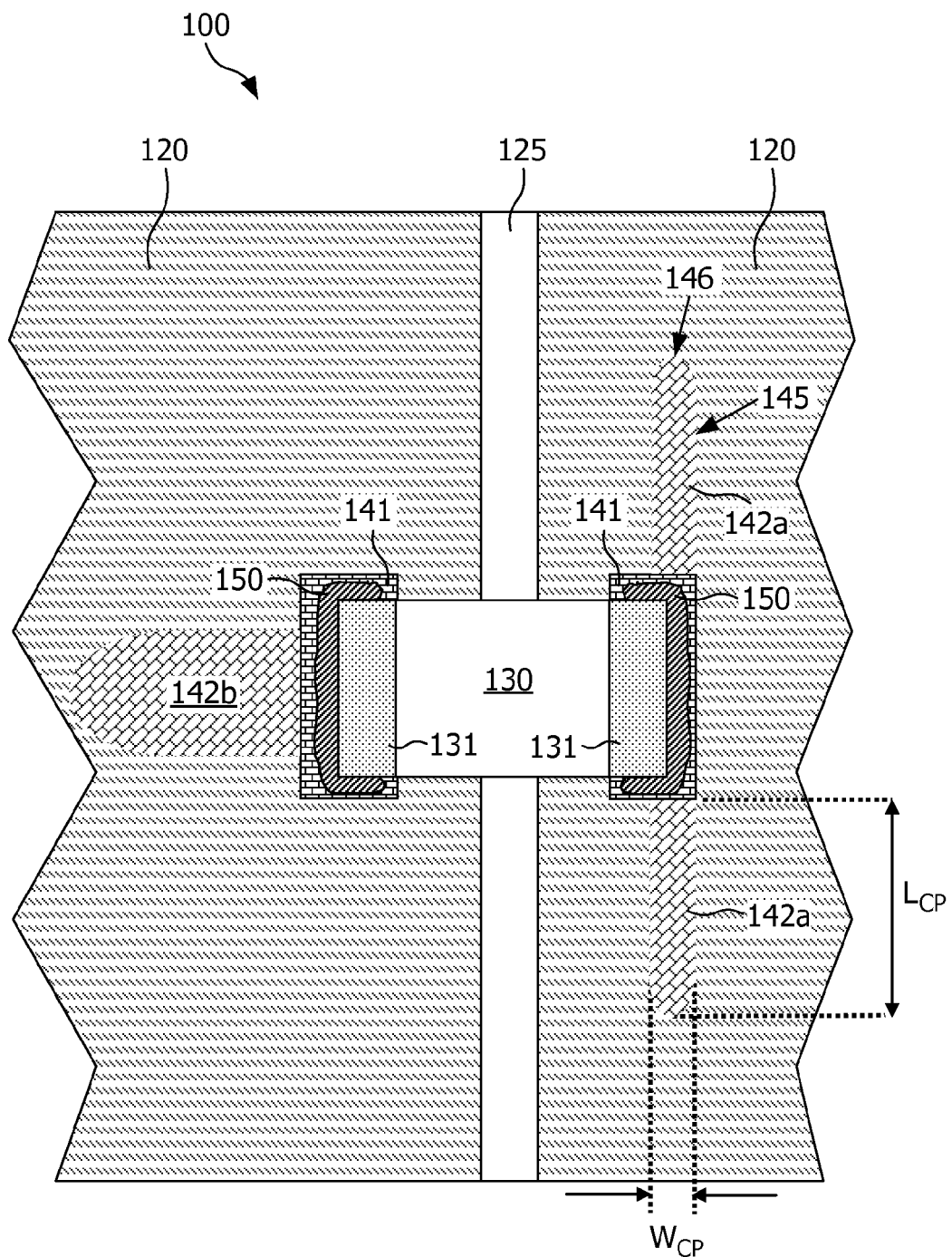
FIG. 2 shows a lighting device according to the invention in top view.
Figure 3:
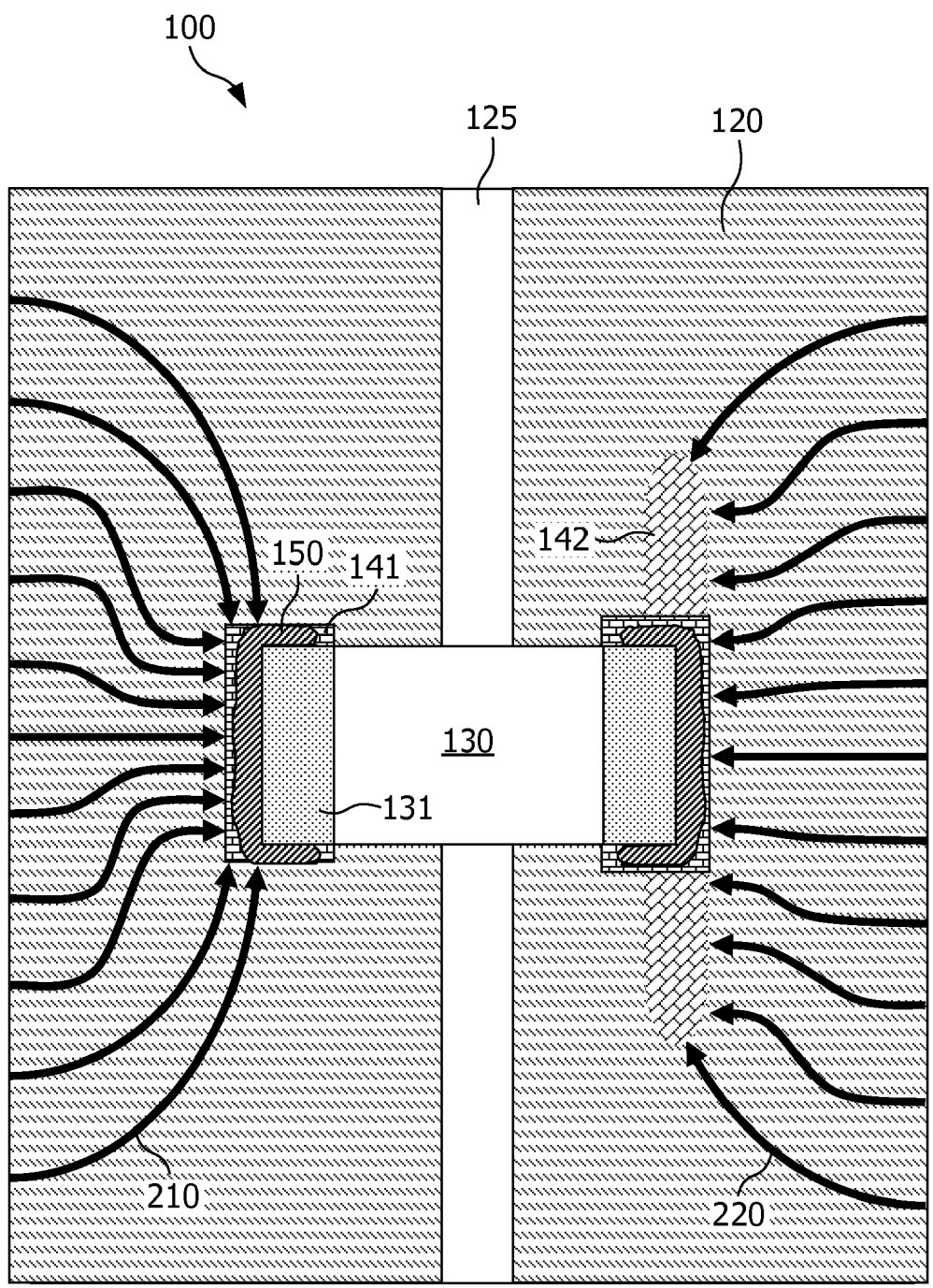
FIG. 3 schematically shows the current density in a prior art lighting device (left hand side) and in a device according to the invention (right hand side.)

The invention provides a solution for this technical problem. According to the invention the contact pads 140 are designed to have two parts (FIG. 2). A first part 141 corresponding to the contact pad known from the prior art, and a second part 142 extending away from the LED 130. This measure creates a larger borderline between the relatively high conductive metallic contact pad 140 and the relatively low conductive transparent layer 120. As a result, the current density 210,220 in the transparent conductive layer directly outside the metallic contact pad 140 is considerably reduced in an embodiment of the invention in operation compared to the prior art. FIG. 3 depicts this graphically, with the prior art situation on the left hand side and the invention on the right hand side. Preferably, the second part 142 of the contact pad 140 is free of (sharp) angles and has a rounded borderline with the conductive layer 120. A rounded borderline prevents increased current density 210,220 levels typically found near (sharp) angled corners.

Usually, the transparent coating 120 is made from ITO. However, many metal-oxide materials are known to be applicable in lighting devices of the kind set forth. They are usually chosen for their specific characteristic combination of light transparency and electrical conductivity. Examples of such metal-oxides are: $InO_x$:Sn, $SnO_x$:F, $SnO_x$:Sb, $ZnO_x$:Ga, $ZnO_x$:B, $ZnO_x$:F, $ZnO_x$:Al and $Ag/TiO_x$. Taking ITO as a general example, a 350 nm thick transparent electrically conductive layer 120 typically has a sheet resistance $R_{tcl}$~15Ω/□. To increase the stability of the lighting device, the contact pad 140 should have a much lower resistance than the conductive layer 120. Metallic coatings are very suitable for this purpose, as for instance a 200 nm thick silver layer can have a sheet resistance as low as $R_{cp}$~0.2 Ω/□.

As shown in FIG. 2, the second part 142 of the contact pad 140 has a longer edge 145 with a length $L_{cp}$ and a shorter edge 146 with a width $W_{cp}$. Note that the second part 142 may consist of several extensions. It has been found that the extension of the contact pad 140 is only beneficial to the lighting device's 100 increase in robustness for a length over width ratio $L_{cp}/W_{cp} < R_{tcl}/R_{cp}$. This can be understood, as otherwise the resistance of the contact pad 140 would be larger than the resistance of the conductive layer 120 of area $L_{cp} \times W_{cp}$. Power dissipation reductions of over 55% have been realised by extending the contact pad 140 in line with the invention. Hence, the invention contributes substantially to the robustness of the lighting device 100.

To protect the LEDs 130 mounted on the glass substrate 110 from the environment, it is preferred to sandwich them using a second glass panel (not shown.) For constructive stability, a transparent foil such as a polyvynilbutyral (PVB), usually fills the space between the sandwiching glass plates 110. With the metal contact pad 140 being non-transparent, it is preferable to assemble the contact pad below the also non-transparent LED 130 as much as possible. As a consequence, it is also preferable to apply top lit LEDs 130 instead of the down lit LEDs 130 disclosed in the prior art. The advantage of this approach lies in the maximization of the optical transparency of the lighting device 100.

To further optimize the transparency, it is beneficial to construct the extension 142 of the contact pad 140 to maximize the contact pad—conductive layer borderline. This is favourably realized by extending perpendicular to the separation groove 125, forming the extension 142b in FIG. 2. In line with the optimization of the transparency of the lighting device 100, the second part's 142 width $W_{cp}$ 146 beneficially is smaller than the size of the contact pad's first part 141 to which the second part 142 is connected, while maintaining the relation $L_{cp} \leq W_{cp} * R_{tcl}/R_{cp}$.

Although the invention has been elucidated with reference to the embodiments described above, it will be evident that other embodiments may be alternatively used to achieve the same object. The scope of the invention is therefore not limited to the embodiments described above, but can also be applied to any other application device where LEDs are mounted on a transparent substrate and electrically addressed through transparent conductive layers.

The invention claimed is:

1. A lighting device comprising
a carrier plate,
a structured electrically conductive layer disposed on a first surface of the carrier plate and having a sheet resistance $R_{tcl}$,
an LED, having a terminal,
a contact pad disposed on the structured electrically conductive layer and having a sheet resistance $R_{cp}$, $R_{cp}$ being lesser than $R_{tcl}$, the contact pad having a first part configured for affixing the LED terminal and a second part configured for reducing peaks of current density in the structured electrically conductive layer, wherein said contact pad is shaped such that the width $W_{cp}$ of the second part is smaller than a corresponding edge of the first part, from which the second part extends.

2. A lighting device according to claim 1, wherein the second part has a length $L_{cp}$ and a width $W_{cp}$, said length $L_{cp}$ and said width $W_{cp}$ satisfying the relation $L_{cp} < W_{cp} * R_{tcl}/R_{cp}$.

3. A lighting device according to claim 2, wherein both the carrier plate and the structured electrically conductive layer are substantially transparent.

4. A lighting device according to claim 1, wherein
the structured electrically conductive layer is structured by a separating groove, and
said length $L_{cp}$ of the second part extends substantially perpendicular to the groove.

5. A lighting device according to claim 1, wherein the contact pad comprises a metal.

6. A lighting device according claim 1, wherein the contact pad is configured with fillets at least at corners of the second part.

7. A lighting device according to claim 1, wherein the electrically conductive layer comprises a metal-oxide selected from the group consisting of $InO_x$:Sn, $SnO_x$:F, $SnO_x$:Sb, $ZnO_x$:Ga, $ZnO_x$:B, $ZnO_x$:F, $ZnO_x$:Al and $Ag/TiO_x$.

8. A lighting device according to claim 1, wherein the structured electrically conductive layer is structured by a separating groove, and said length $L_{cp}$ of the second part extends substantially parallel to the groove.

9. A lighting device comprising:
a carrier plate,
a structured electrically conductive layer disposed on a first surface of the carrier plate and having a sheet resistance $R_{tcl}$,
an LED, having a terminal, and
a contact pad disposed on the structured electrically conductive layer and having a sheet resistance $R_{cp}$, $R_{cp}$ being lesser than $R_{tcl}$, the contact pad having a first part configured for affixing the LED terminal and a second part configured for reducing peaks of current density in the structured electrically conductive layer, wherein the electrically conductive layer comprises a metal-oxide selected from the group consisting of $InO_x$:Sn, $SnO_x$:F, $SnO_x$:Sb, $ZnO_x$:Ga, $ZnO_x$:B, $ZnO_x$:F, $ZnO_x$:Al and $Ag/TiO_x$.

10. A lighting device according to claim 9, wherein the second part has a length $L_{cp}$ and a width $W_{cp}$, said length $L_{cp}$ and said width $W_{cp}$ satisfying the relation $L_{cp} < W_{cp} * R_{tcl}/R_{cp}$.

11. A lighting device according to claim 10, wherein the structured electrically conductive layer is structured by a separating groove, and said length $L_{cp}$ of the second part extends substantially perpendicular to the groove.

12. A lighting device according to claim 10, wherein the structured electrically conductive layer is structured by a separating groove, and said length $L_{cp}$ of the second part extends substantially parallel to the groove.

13. A lighting device according to claim 9, wherein the contact pad comprises a metal.

* * * * *